(12) United States Patent
Lin et al.

(10) Patent No.: US 12,369,435 B2
(45) Date of Patent: Jul. 22, 2025

(54) LIGHT-EMITTING DIODE

(71) Applicant: XIAMEN SAN'AN OPTOELECTRONICS CO., LTD., Xiamen (CN)

(72) Inventors: Su-Hui Lin, Xiamen (CN); Sheng-Hsien Hsu, Xiamen (CN); Meng-Chun Shen, Xiamen (CN); Sihe Chen, Xiamen (CN); Yu-Chieh Huang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 861 days.

(21) Appl. No.: 17/454,079

(22) Filed: Nov. 9, 2021

(65) Prior Publication Data
US 2022/0123173 A1 Apr. 21, 2022

Related U.S. Application Data

(63) Continuation-in-part of application No. PCT/CN2020/089147, filed on May 8, 2020.

(30) Foreign Application Priority Data

May 13, 2019 (CN) .......................... 201920679199.3

(51) Int. Cl.
*H10H 20/82* (2025.01)
*H10H 20/83* (2025.01)
(Continued)

(52) U.S. Cl.
CPC ........ *H10H 20/82* (2025.01); *H10H 20/8312* (2025.01); *H10H 20/83* (2025.01); *H10H 20/831* (2025.01); *H10H 20/833* (2025.01)

(58) Field of Classification Search
None
See application file for complete search history.

(56) References Cited

U.S. PATENT DOCUMENTS

2014/0042486 A1* 2/2014 Choi .................. H10D 84/8316
257/99

FOREIGN PATENT DOCUMENTS

| CN | 205376566 U | 7/2016 |
| CN | 209804697 U | 12/2019 |

OTHER PUBLICATIONS

Li, CN 205376566, Packaging Structure of LED Chip, Jul. 6, 2016. (Year: 2016).*

(Continued)

*Primary Examiner* — Alexander G Ghyka
(74) *Attorney, Agent, or Firm* — Muncy, Geissler, Olds & Lowe, P.C.

(57) ABSTRACT

A light-emitting diode (LED) includes a substrate, an epitaxial structure, and an electrode structure. The epitaxial structure includes a first semiconductor layer, an active layer and a second semiconductor layer that are sequentially disposed on the substrate in such order. The electrode structure includes electrodes that are respectively disposed on the first and second semiconductor layers opposite to the substrate. Each electrode has an upper surface that is opposite to the first and second semiconductor layers. The electrode structure also includes an insulating unit that is disposed in each electrode, and that is not exposed from the upper surface of the corresponding electrode.

16 Claims, 10 Drawing Sheets

(51) Int. Cl.
*H10H 20/831* (2025.01)
*H10H 20/833* (2025.01)

(56) References Cited

OTHER PUBLICATIONS

Search Report issued to PCT Application No. PCT/CN2020/089147 on Jul. 29, 2020.

* cited by examiner

LIGHT-EMITTING DIODE

CROSS-REFERENCE TO RELATED APPLICATION

This application is a bypass continuation-in-part application of PCT International Application No. PCT/CN2020/089147 filed on May 8, 2020, which claims priority of Chinese Utility Model Patent Application No. 201920679199.3 filed on May 13, 2019. The entire content of each of the international and Chinese patent applications is incorporated herein by reference.

FIELD

The disclosure relates to a semiconductor device, and more particularly to a light-emitting diode.

BACKGROUND

Light-emitting diodes (LED) have advantages such as long service life and low power consumption, and thus, are applied in various fields. With improvements in lighting properties, LEDs have been widely employed in various aspects such as optical display, traffic indicator, data storage device, communication device, and lighting apparatus.

A conventional gallium nitride (GaN)-based LED may generally have a substrate, and an epitaxial structure that includes a non-doped GaN layer, an n-type GaN layer, a multiple-quantum well (MQW) and a p-type GaN layer sequentially disposed on the substrate in such order. During manufacture of the LED, the epitaxial structure is etched to remove portions of the p-type GaN layer and the MQW, and to expose the n-type GaN layer, and a p-n junction is formed in the epitaxial structure. Then, an electrode unit including a p-type electrode and an n-type electrode is formed in a platform structure on the p-type GaN layers and the exposed n-type GaN layers opposite to the substrate. During a wire bonding process for packaging the LED, the electrode unit might experience a compression force exerted by solder balls, resulting in deformation of the platform structure of the electrode unit, especially at a bottom part of the electrode unit. In addition, since the electrode unit is made of a material different from the materials of the p-type and n-type GaN layers that are in contact with the electrode unit, the adhesion therebetween is relatively poor. As such, when the electrode unit is subjected to the compression force during the wire bonding process, the electrode unit might be easily separated from the GaN layers, which might adversely affect electrical conduction property of the LED.

SUMMARY

Therefore, an object of the disclosure is to provide a light-emitting diode (LED) that can alleviate at least one of the drawbacks of the prior art.

According to the disclosure, the LED includes a substrate, an epitaxial structure, and an electrode structure. The epitaxial structure includes a first semiconductor layer, an active layer and a second semiconductor layer sequentially disposed on the substrate in such order. The first semiconductor layer is formed as a step structure which includes a first portion and a second portion having a height lower than a height of the first portion. The active layer and the second semiconductor layer are disposed on the first portion. The electrode structure includes electrodes that are respectively disposed on the second portion of the first semiconductor layer and disposed on the second semiconductor layer opposite to the substrate. Each of the electrodes has an upper surface and a lower surface that are respectively distal from and proximal to the substrate. The electrode structure also includes an insulating unit that is disposed in each of the electrodes, and is not exposed from the upper surface of each of the electrodes.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
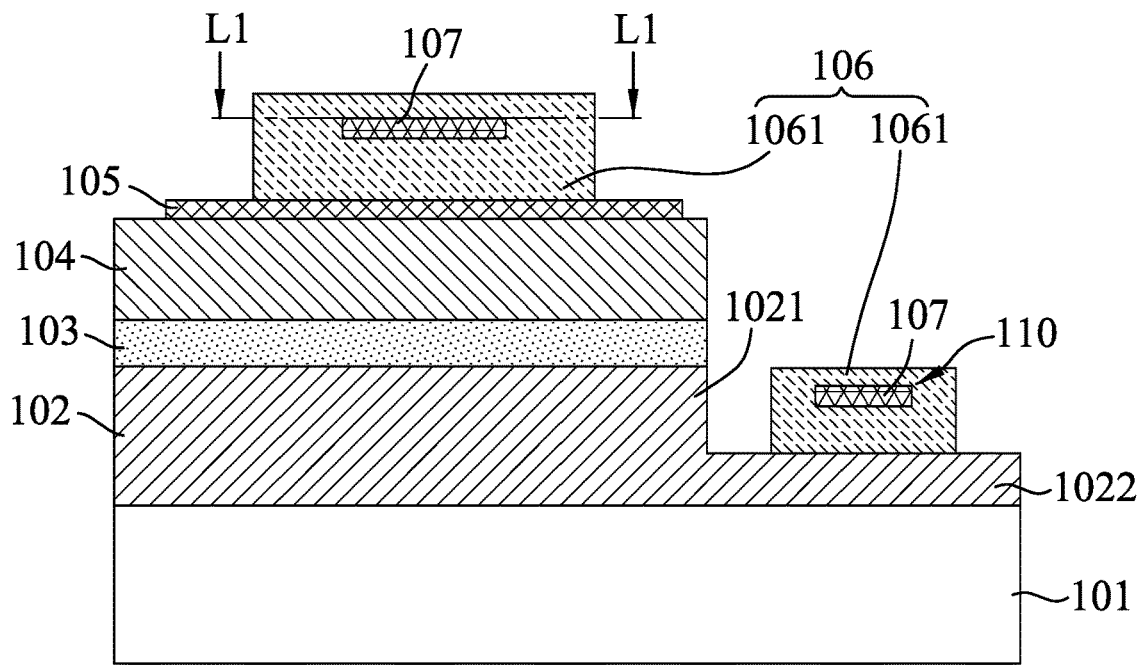
FIG. 1 is a cross-sectional schematic view illustrating a first embodiment of a light-emitting diode (LED) according to the disclosure.
Figure 2:
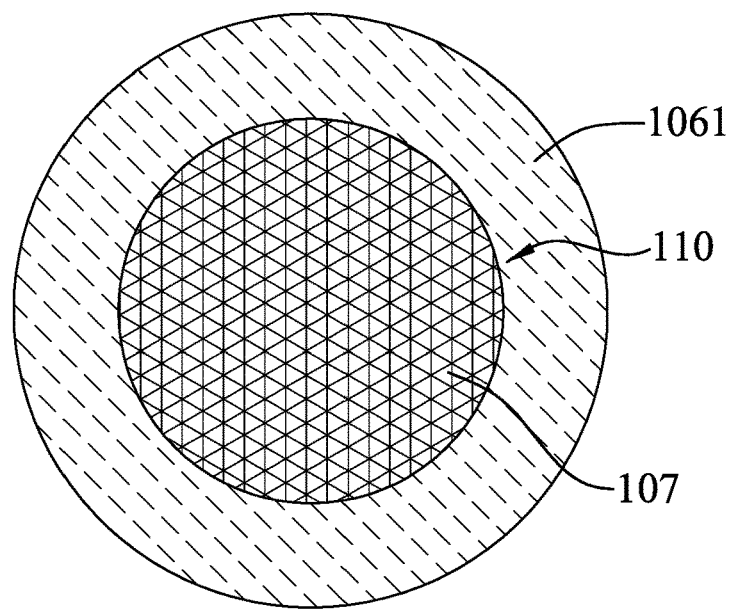
FIG. 2 is a schematic view taken along line L1-L1 in FIG. 1, illustrating an insulating unit in an electrode structure of the first embodiment of the LED according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light-emitting diode (LED) 100 according to the disclosure includes a substrate 101, an epitaxial structure and an electrode structure 106.

The substrate 101 may be any substrate that is commonly used in the semiconductor field. For instance, the substrate 101 may be made of an insulating material. Examples of the insulating material may include, but are not limited to, silicone rubber, quartz, glass, aluminum nitride and ceramics.

The epitaxial structure includes a first semiconductor layer 102, an active layer 103 and a second semiconductor layer 104 that are sequentially disposed on the substrate 101 in such order. The first semiconductor layer 102 may be formed as a step structure which includes a first portion 1021 and a second portion 1022 which has a height lower than a height of the first portion 1021. The active layer 103 and the second semiconductor layer 104 may be disposed on the first portion 1021.

The first semiconductor layer 102 may have conductivity opposite to that of the second semiconductor layer 104. For instance, the first semiconductor layer 102 may be a p-type semiconductor layer, and the second semiconductor layer 104 may be an n-type semiconductor layer, or vice versa. In this embodiment, the first semiconductor layer 102 is an n-type semiconductor layer, and the second semiconductor layer 104 is a p-type semiconductor layer. The active layer 103 may be an intrinsic (i-type), p-type, or n-type semiconductor. The active layer 103 is configured to emit light with a predetermined wavelength. For example, when the active layer 103 is made of a nitride-based material, the LED 100 is capable of emitting blue light or green light. When the active layer 103 is made of an aluminum gallium indium phosphide (AlGaInP)-based material, the LED 100 is capable of emitting amber light such as red light, orange light or yellow light.

As shown in FIG. 1, the electrode structure 106 includes two electrodes 1061 that are respectively disposed on the second portion 1022 of the first semiconductor layer 102 and the second semiconductor layer 104 opposite to the substrate 101. Each of the electrodes 1061 has an upper surface and a lower surface that are respectively distal from and proximal to the substrate 101, and a lateral surface interconnecting the upper surface and the lower surface. At least one of the electrodes 1061 may be formed as a cylinder shape. The electrode structure 106 is used for wire bonding during packaging of the LED 100.

Each of the electrodes 1061 may have a multi-layered structure (not shown in figures), in which each layer may be independently made of a metallic material. One of the layers proximal to the epitaxial structure may serve as a reflecting layer to reflect light that is emitted from the active layer 103 so as to increase light utilization efficiency of the LED 100. The reflective layer may be made of a reflective material such as aluminum (Al) or silver (Ag). A topmost layer of each of the electrodes 1061 may serve as a wire bonding layer that is configured to be attached to an external wire component during a wire bonding process. Since the above-mentioned reflective material is prone to oxidation, or migration due to moisture, each of the electrodes 1061 may further include a blocking layer disposed between the wire bonding layer and the reflecting layer, so as to avoid diffusion or migration of the reflective material. The blocking layer may be made of titanium (Ti), platinum (Pt), nickel (Ni) or tungsten (W).

The electrode structure 106 further includes an insulating unit 110 that is disposed in each of the electrodes 1061, and that is not exposed from the upper surface of each of the electrodes 1061. The insulating unit 110 may be made from an oxide (such as silicon dioxide, silicon oxide and aluminum oxide) and/or a nitride (e.g., silicon nitride).

With the insulating unit 110, the different layers of each of the electrodes 1061 made of different metallic materials may be separated from each other by the insulating unit 110 formed therein. In addition, the insulating unit 110 has a malleability smaller than that of the corresponding electrode 1061. Therefore, when the LED 100 of this disclosure is subjected to a wire bonding process, the insulating unit 110 may effectively prevent a compression force thus generated from being directly exerted onto the corresponding electrode 1061, so as to alter the distribution of the compression force on the corresponding electrode 1061. As such, fracture or deformation of the electrodes 1061, especially bottom parts (e.g., the reflective layers) of the electrodes 1061, which might result in diffusion or migration of the metal within the electrodes 1061 that causes a malfunction of the electrodes 1061, may be effectively prevented, so that the electrodes 1061 and solder balls remain intact and do not fall apart during the subsequent packaging process of the LED 100.

In this embodiment, the insulating unit 110 includes a plate structure 107 that is interposed between two immediately adjacent layers of a corresponding one of the electrodes 1061. The plate structure 107 may have a diameter smaller than that of the corresponding electrode 1061, and a thickness smaller that of the corresponding electrode 1061. That is, the plate structure 107 is embedded in the corresponding electrode 1061 and does not affect electrical conduction between the corresponding electrode 1061 and the epitaxial structure, and also does not affect electrical conduction between solder balls and the corresponding electrode 1061 during a wire bonding process. Thus, electrical conductivity of the LED 100 remains unaffected.

The thickness of the plate structure 107 may range from 100 nm to 6000 nm. The plate structure 107 may be formed as a disc shape. In certain embodiments, a centroid of the plate structure 107 aligns with that of the corresponding electrode 1061 along a line perpendicular to the lower surface of the corresponding electrode 1061 so that when the LED 100 is subjected to the wire bonding process, the compression force thus generated may be evenly distributed over the plate structure 107, and may be more effectively prevented from being exerted onto the corresponding electrode 1061.

In certain embodiments, the LED 100 further includes a current spreading layer 105 which is disposed between the epitaxial structure and the electrode structure 106. In this embodiment, the current spreading layer 105 is disposed on the second semiconductor layer 104. The current spreading layer 105 may also be formed on the second portion 1022 of the first semiconductor layer 102. The current spreading layer 105 may be made of an electrically conducting material commonly used in the semiconductor field, such as indium tin oxide (ITO).

Figure 3:
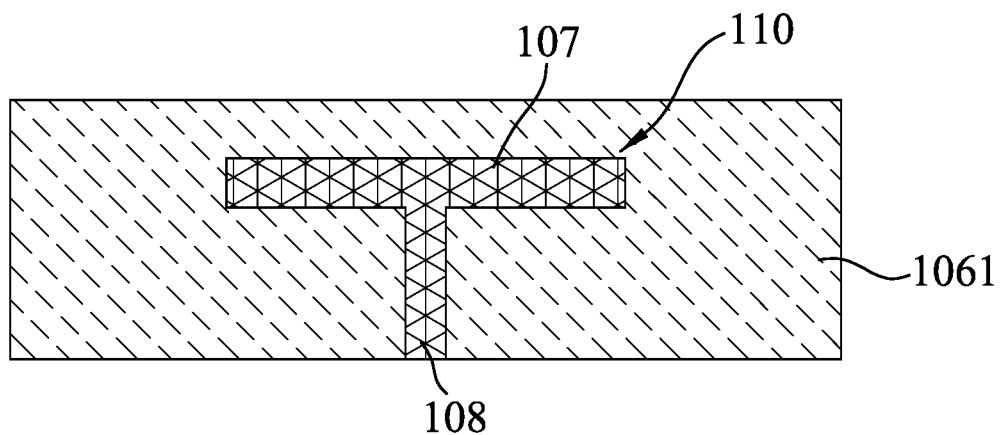
FIG. 3 is a cross-sectional schematic view illustrating the insulating unit in the electrode structure of a variation of the first embodiment of the LED according to the disclosure.

Referring to FIG. 3, in a variation of the first embodiment, the insulating unit 110 further includes a supporting structure 108 which extends in an extension direction from the plate structure 107 towards the epitaxial structure. The supporting structure 108 may further prevent the compression force from being exerted onto the corresponding electrode 1061. The supporting structure 108 may be formed as a cylinder shape. The supporting structure 108 may have a diameter smaller than that of the plate structure 107, and a thickness not greater than a distance between the plate structure 107 and the lower surface of the corresponding electrode 1061. In certain embodiments, at least one layer of the corresponding electrode 1061 is partially or entirely penetrated by the supporting structure 108. In this variation of the first embodiment, the supporting structure 108 extends from the centroid of the plate structure 107 to the lower surface of the corresponding electrode 1061.

Figure 4:
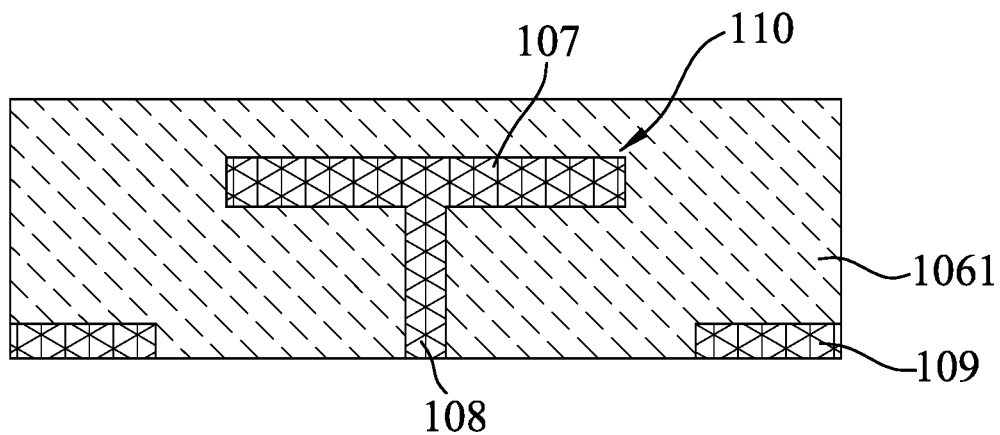
FIG. 4 is a cross-sectional schematic view similar to FIG. 3, illustrating the insulating unit in the electrode structure of another variation of the first embodiment of the LED according to the disclosure.

Referring to FIG. 4, another variation of the first embodiment is generally similar to the abovementioned variation shown in FIG. 3, except that the insulating unit 110 may further include a peripheral ring structure 109 which is located at a level different from that of the plate structure 107. The peripheral ring structure 109 may have an outer diameter that is not greater than the diameter of the corresponding electrode 1061, and an inner diameter of the peripheral ring structure 109 is greater than the diameter of the supporting structure 108. Such configuration of the insulating unit 110 does not affect continuity of the corresponding electrode 1061, and also does not affect the electrical connection between the corresponding electrode 1061 and the epitaxial structure. In this variation, the peripheral ring structure 109 has an outer diameter identical to the diameter of the corresponding electrode 1061.

Figure 5:
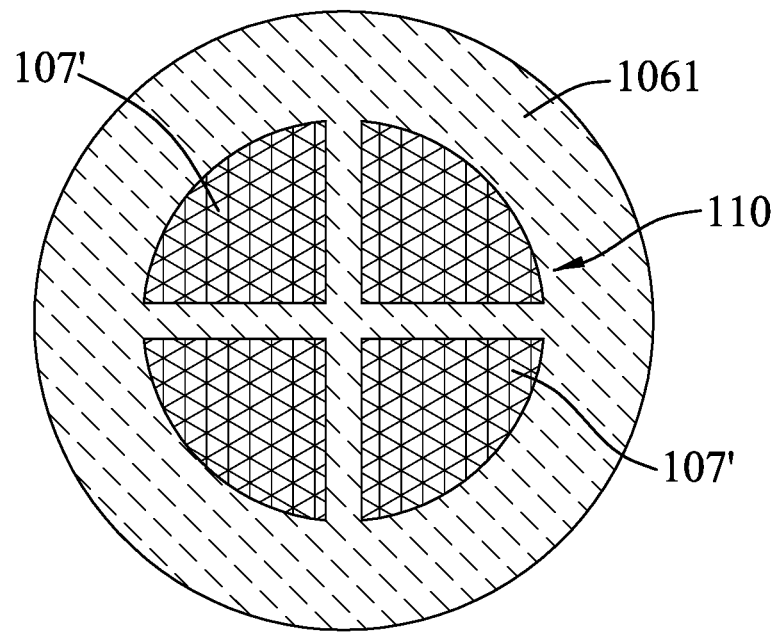
FIG. 5 is a schematic view similar to FIG. 2, illustrating the insulating unit in the electrode structure of the second embodiment of the LED according to the disclosure.

Referring to FIG. 5, a second embodiment of the LED 100 according to the disclosure is generally similar to the first embodiment, except that in the second embodiment, the plate structure 107 of the insulating unit 110 is formed as discrete segments 107'. Each segment 107' may be in a sector shape. In this embodiment, the plate structure 107 is formed as four discrete segments 107', but is not limited thereto.

Similar to the variations of the first embodiment, the insulating unit 110 of the second embodiment may also further include the supporting structure 108 and/or the peripheral ring structure 109 as shown in FIGS. 3 and 4.

Figure 6:
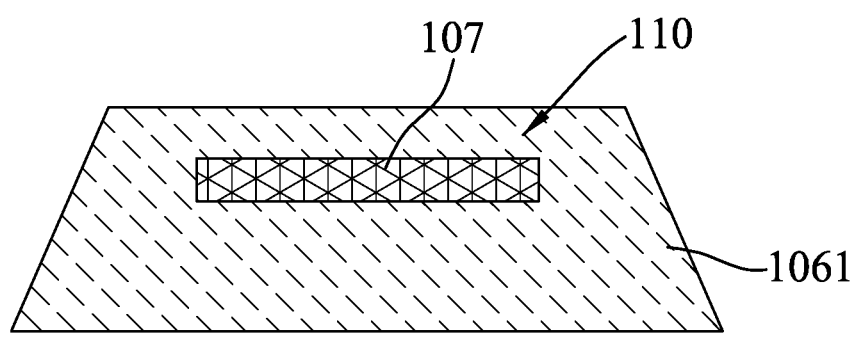
FIG. 6 is a cross-sectional schematic view similar to FIG. 3, illustrating the insulating unit in the electrode structure of a third embodiment of the LED according to the disclosure.

Referring to FIG. 6, a third embodiment of the LED 100 according to the disclosure is generally similar to the first embodiment, except that in the third embodiment, at least one of the electrodes 1061 is formed as a frustoconical shape and has a diameter that increases from the upper surface toward the lower surface. That is, a cross-sectional surface of the at least one of the electrodes 1061 along the extension direction has a trapezoid shape. In such case, the plate structure 107 has a diameter smaller than that of the corresponding electrode 1061 at a level identical to the level of the plate structure 107.

Similar to the variations of the first embodiment, the insulating unit 110 of the third embodiment may also further include the supporting structure 108 and/or the peripheral ring structure 109 as shown in FIGS. 3 and 4. In the latter case, the peripheral ring structure 109 is configured to conform to the angularity of the corresponding electrode 1061.

Figure 7:
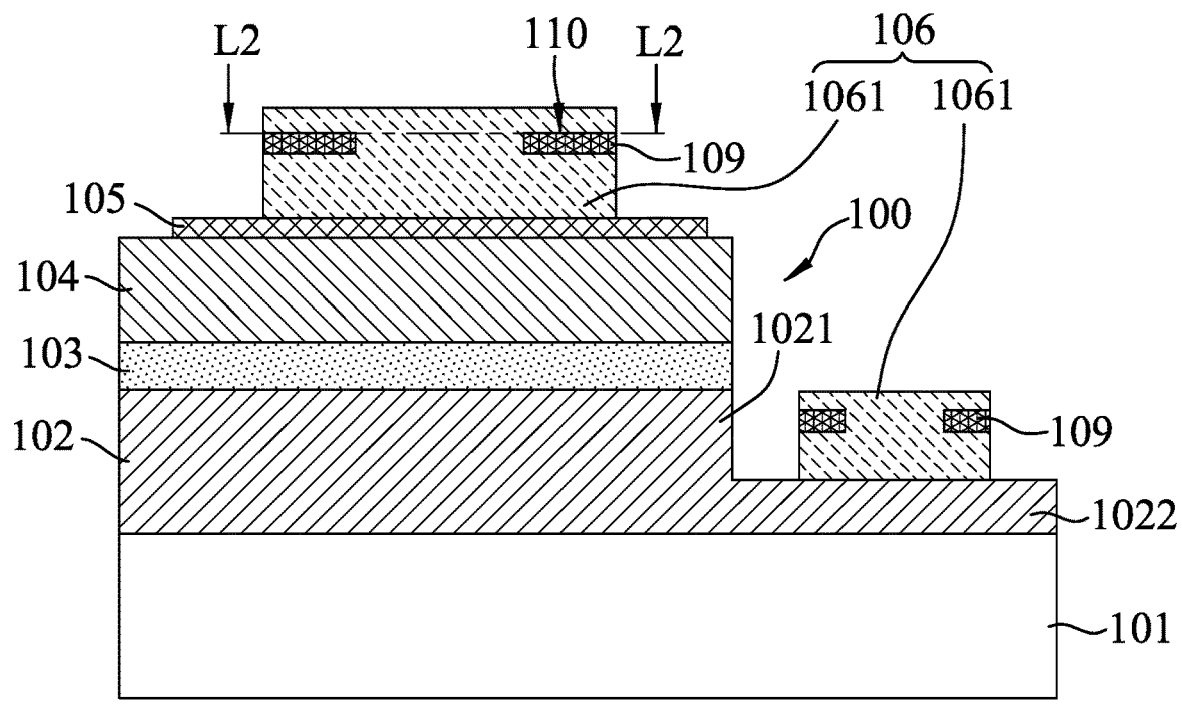
FIG. 7 is a cross-sectional schematic view illustrating a fourth embodiment of the LED according to the disclosure.
Figure 8:
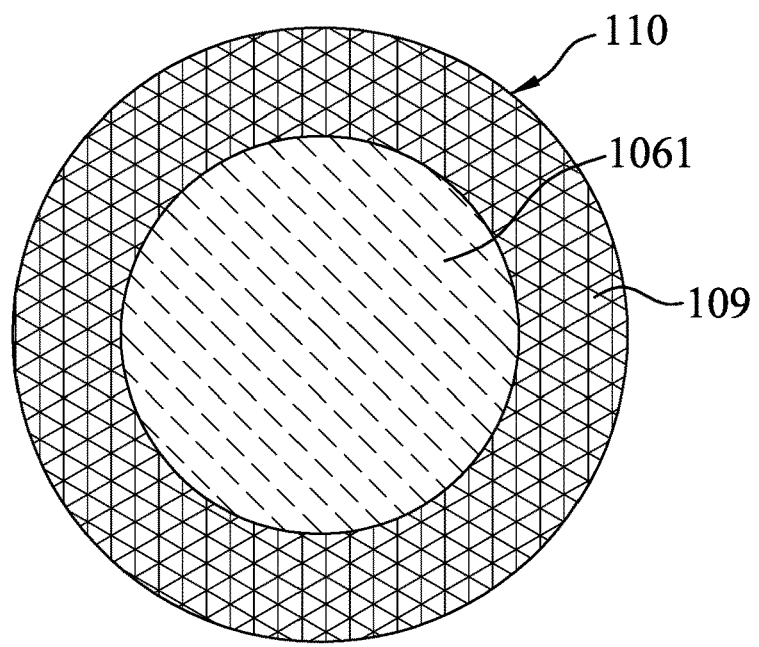
FIG. 8 is a schematic view taken along line L2-L2 in FIG. 7, illustrating the insulating unit in the electrode structure of the fourth embodiment of the LED according to the disclosure.

Referring to FIGS. 7 and 8, a fourth embodiment of the LED 100 according to the disclosure is generally similar to the first embodiment, except that in the fourth embodiment, the insulating unit 110 only includes the peripheral ring structure 109 which has an outer diameter not greater than a diameter of the corresponding electrode 1061 and which has a thickness smaller than that of the corresponding electrode 1061. In this embodiment, the peripheral ring structure 109 has an outer diameter identical to the diameter of the corresponding electrode 1061. The peripheral ring structure 109 is formed with an opening that is filled with the corresponding electrode 1061. A centroid of the peripheral ring structure 109 may align with that of the corresponding electrode 1061, so that when the LED 100 is subjected to a wire bonding process, the compression force thus generated may be evenly distributed over the peripheral ring structure 109, and may be more effectively prevented from being exerted onto the corresponding electrode 1061.

The insulating unit 110, especially the peripheral ring structure 109, is capable of forming a capacitor at a peripheral portion of the corresponding electrode 1061. The capacitor may improve resistance to electrostatic breakdown of the corresponding electrode 1061, so as to enhance reliability and to prolong the service life of the LED 100.

Figure 9:
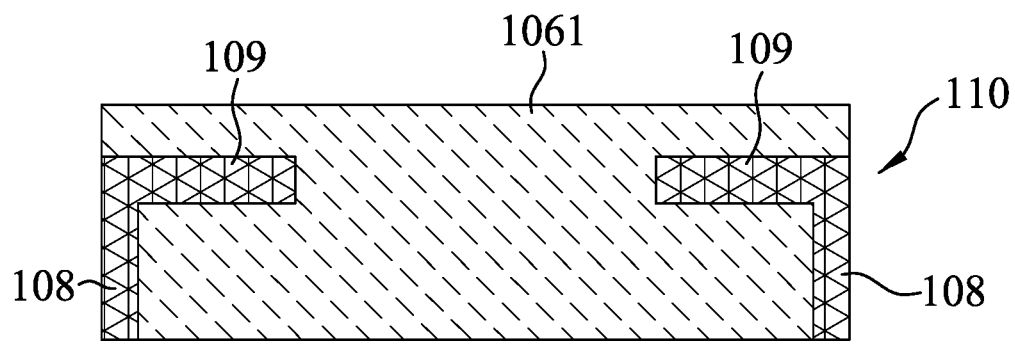
FIG. 9 is a cross-sectional schematic view illustrating the insulating unit in the electrode structure of a variation of the fourth embodiment of the LED according to the disclosure.

Referring to FIG. 9, in a variation of the fourth embodiment, the insulating unit 110 further includes the supporting structure 108 that extends in the extension direction from the peripheral ring structure 109 towards the epitaxial structure. In a direction perpendicular to the extension direction, the supporting structure 108 has a thickness smaller than a difference between the outer diameter and the inner diameter of the peripheral ring structure 109. In certain embodiments, the supporting structure 108 and the peripheral ring structure 109 may have a total thickness along the extension direction which is smaller than that of the corresponding electrode 1061. In this embodiment, the supporting structure 108 extends from outermost regions of the peripheral ring structure 109 to the lower surface of the corresponding electrode 1061, but is not limited thereto.

Figure 10:
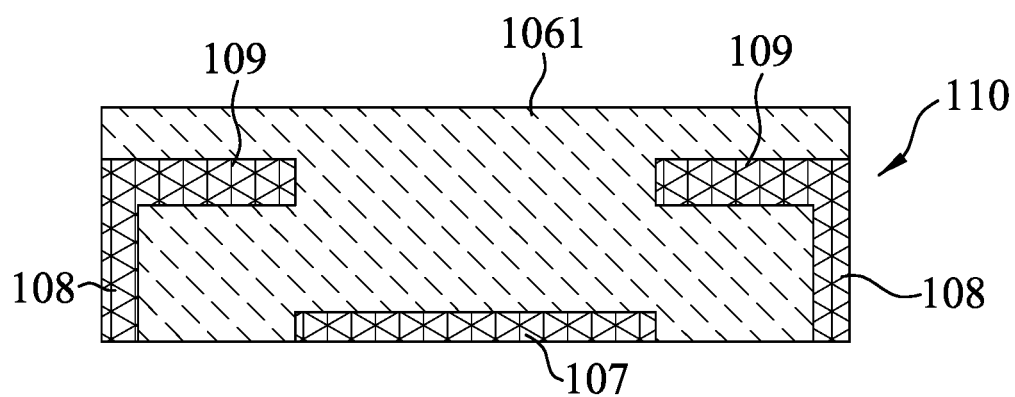
FIG. 10 is a cross-sectional schematic view similar to FIG. 9, illustrating the insulating unit in the electrode structure of another variation of the fourth embodiment of the LED according to the disclosure.

Referring to FIG. 10, another variation of the fourth embodiment is generally similar to the variation of the fourth embodiment as shown in FIG. 9, except that in the another variation, the insulating unit 110 further includes the plate structure 107 which is disposed inward of the supporting structure 108 and which is located at a level different from that of the peripheral ring structure 109. The plate structure 107 may have a diameter smaller than an inner diameter of the supporting structure 108, and may have a thickness in the extension direction smaller than that of the supporting structure 108. Such configuration of the insulating unit 110 does not affect continuity of the corresponding electrode 1061, and also does not affect the electrical connection between the corresponding electrode 1061 and the epitaxial structure.

Figure 11:
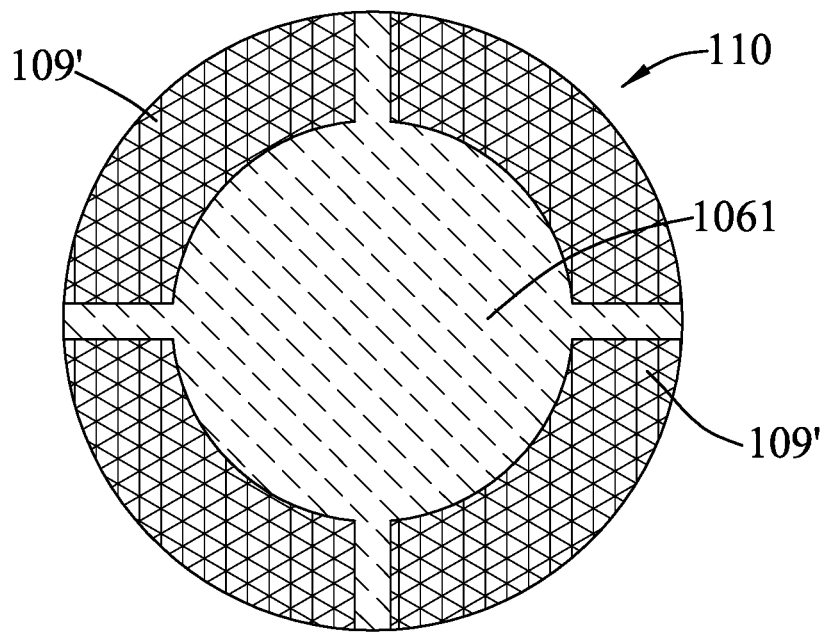
FIG. 11 is a schematic view similar to FIG. 8, illustrating the insulating unit in the electrode structure of a fifth embodiment of the LED according to the disclosure.

Referring to FIG. 11, a fifth embodiment of the LED 100 according to the disclosure is generally similar to the fourth embodiment, except that in the fifth embodiment, the peripheral ring structure 109 is formed as discrete segments 109', e.g., annular sectors. In this embodiment, the peripheral ring structure 109 of the insulating unit 110 is formed as four discrete segments 109', but is not limited thereto. Similar to the variations of the fourth embodiment, the insulating unit 110 of the fifth embodiment may also further include the supporting structure 108 and/or the plate structure 107 as shown in FIGS. 9 and 10.

Figure 12:
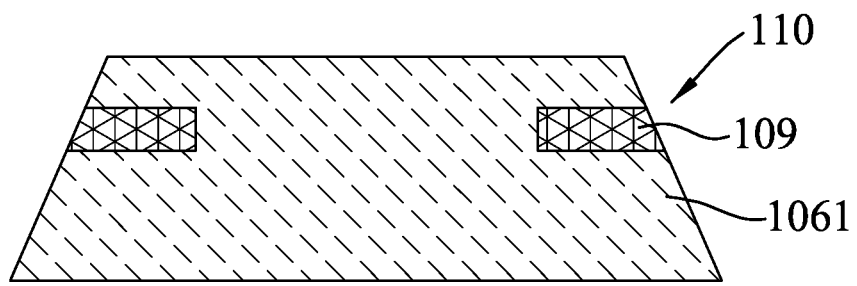
FIG. 12 is a cross-sectional schematic view similar to FIG. 6, illustrating the insulating unit in the electrode structure of a sixth embodiment of the LED according to the disclosure.

Referring to FIG. 12, a sixth embodiment of the LED 100 according to the disclosure is generally similar to the fourth embodiment, except that in the sixth embodiment, at least one of the electrodes 1061 is formed as a frustoconical shape and has a diameter that increases from the upper surface toward the lower surface. In certain embodiments, when the peripheral ring structure 109 has an outer diameter which is identical to the diameter of the corresponding electrode 1061 at a level where the peripheral ring structure 109 is disposed, the peripheral ring structure 109 is configured to conform to the angularity of the corresponding electrode 1061.

Similar to the variations of the fourth embodiment, the insulating unit 110 of the sixth embodiment may further include the supporting structure 108, and/or the plate structure 107 as shown in FIGS. 9 and 10. The supporting structure 108, if present, may be configured to conform to the angularity of the corresponding electrode 1061 (see FIGS. 19 and 20).

Figure 13:
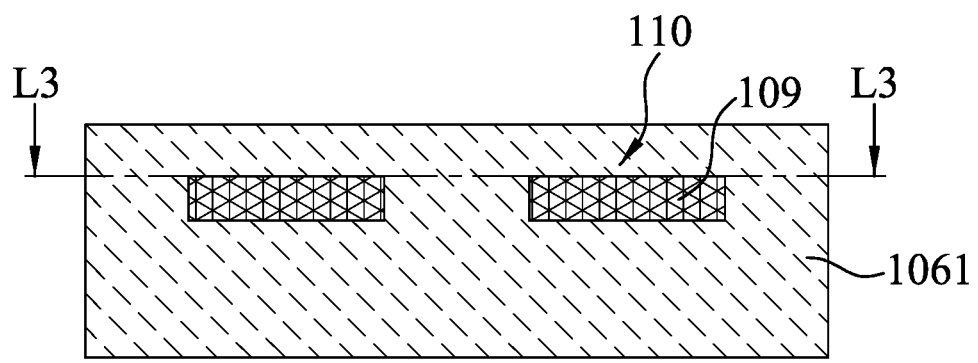
FIG. 13 is a cross-sectional schematic view illustrating the insulating unit in the electrode structure of a seventh embodiment of the LED according to the disclosure.
Figure 14:
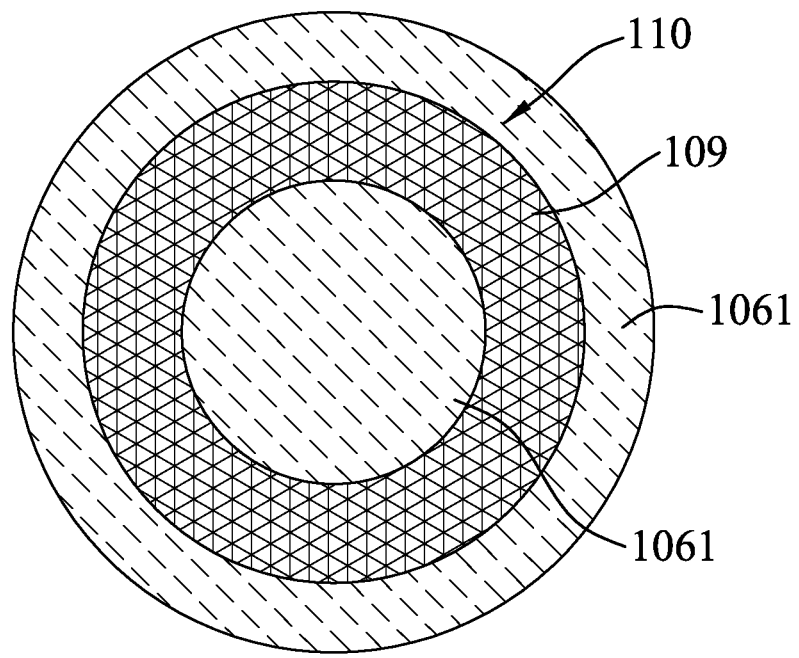
FIG. 14 is a schematic view taken along line L3-L3 in FIG. 13, illustrating the insulating unit in the electrode structure of the seventh embodiment of the LED according to the disclosure.

Referring to FIGS. 13 and 14, a seventh embodiment of the LED 100 according to the disclosure is generally similar to the fourth embodiment, except that in the seventh embodiment, the peripheral ring structure 109 has an outer diameter smaller than the diameter of the corresponding electrode 1061, and is not exposed from the lateral surface of the corresponding electrode 1061.

Figure 15:
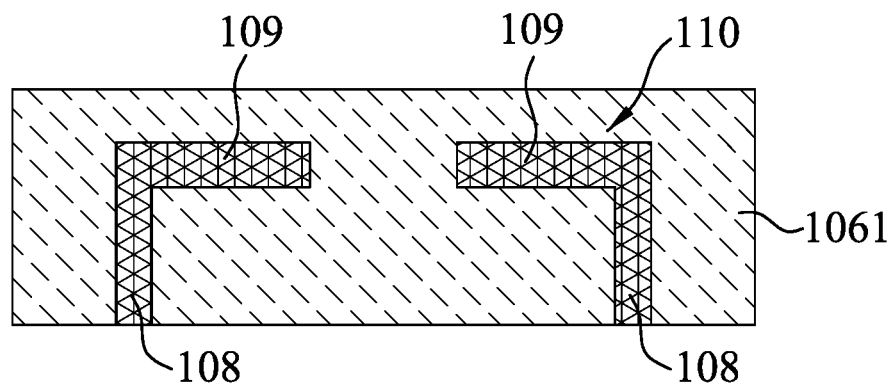
FIG. 15 is a cross-sectional schematic view similar to FIG. 13, illustrating the insulating unit in the electrode structure of a variation of the seventh embodiment of the LED according to the disclosure.

Referring to FIG. 15, a variation of the seventh embodiment further includes the supporting structure 108, and the configuration thereof is similar to that described in the variation of the fourth embodiment (with reference to FIG. 9), and thus the details thereof are omitted herein for sake of brevity.

Figure 16:
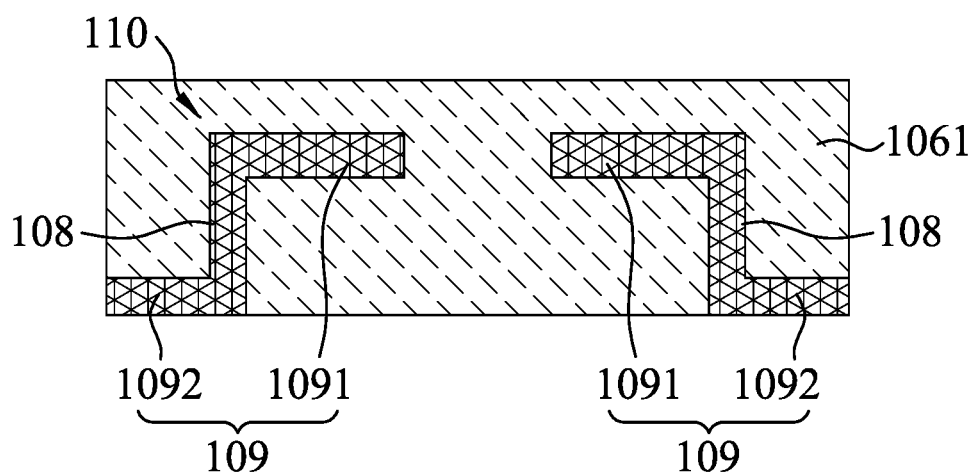
FIG. 16 is a cross-sectional schematic view similar to FIG. 13, illustrating the insulating unit in the electrode structure of another variation of the seventh embodiment of the LED according to the disclosure.

Referring to FIG. 16, another variation of the seventh embodiment is generally similar to the variation of the seventh embodiment shown in FIG. 15, except that in such another variation, the peripheral ring structure 109 includes an inner ring part 1091 and an outer ring part 1092. The inner ring part 1091 has an outer diameter smaller than the diameter of the corresponding electrode 1061. The outer ring part 1092 is disposed outward of the supporting structure 108, and is located at a level different from that of the inner ring part 1091. The outer ring part 1092 has an outer diameter that is not greater than the diameter of the corresponding electrode 1061, and has an inner diameter that is greater than a diameter of the supporting structure 108. The outer ring part 1092 has a thickness that is smaller than a thickness of the supporting structure 108 in the extension direction. Such configuration of the insulating unit 110 does not affect continuity of the corresponding electrode 1061, and also does not affect electrical connection between the corresponding electrode 1061 and the epitaxial structure. In certain embodiments, the outer ring part 1092 and an insulating layer to be formed for surrounding the corresponding electrode 1061 may be formed as a continuous structure, so as to simplify a manufacturing process of the insulating unit 110.

Figure 17:
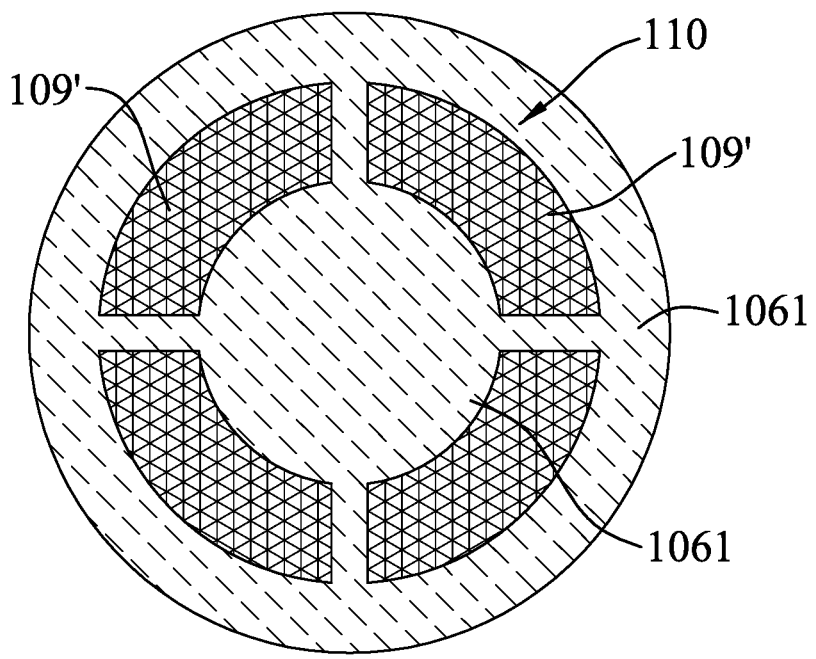
FIG. 17 is a schematic view similar to FIG. 14, illustrating the insulating unit in the electrode structure of the eighth embodiment of the LED according to the disclosure.

Referring to FIG. 17, an eighth embodiment of the disclosure is similar to the seventh embodiment, except that in the eighth embodiment, the peripheral ring structure 109 is formed as discrete segments 109', e.g., discrete annular sectors. In this embodiment, the peripheral ring structure 109 of the insulating unit 110 is formed as four discrete segments 109', but is not limited thereto. Similar to the seventh embodiment, the insulating unit 110 of the eighth embodiment may also further include the supporting structure 108 shown in FIG. 15, and/or the peripheral ring structure 109 may include the outer ring part 1091 and the inner ring part 1092 as shown in FIG. 16.

Figure 18:
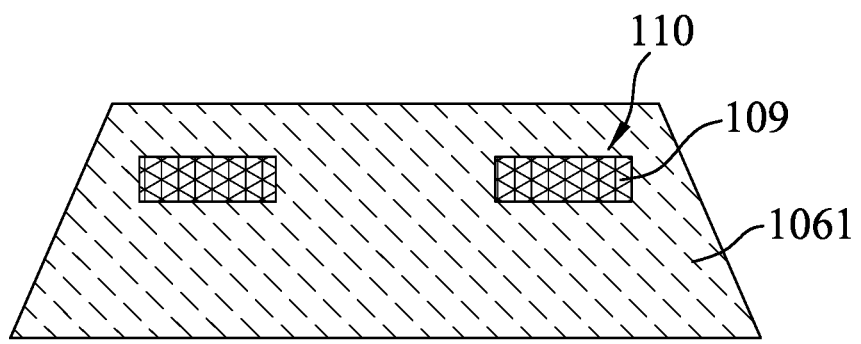
FIG. 18 is a cross-sectional schematic view similar to FIG. 12, illustrating the insulating unit in the electrode structure of the ninth embodiment of the LED according to the disclosure.

Referring to FIG. 18, a ninth embodiment of the disclosure is generally similar to the seventh embodiment, except that in the ninth embodiment, at least one of the electrodes 1061 is formed as a frustoconical shape and has a diameter that increases from the upper surface toward the lower surface.

Figure 19:
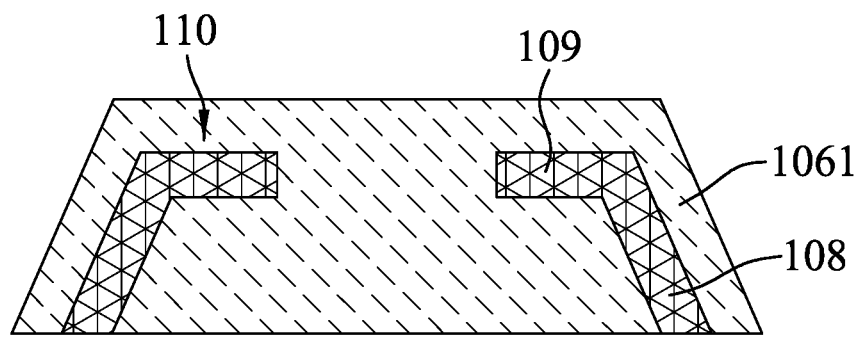
FIG. 19 is a cross-sectional schematic view similar to FIG. 18, illustrating the insulating unit in the electrode structure of a variation of the ninth embodiment of the LED according to the disclosure.

Referring to FIG. 19, in a variation of the ninth embodiment, the insulating unit 110 further includes the supporting structure 108 which is similar to that of the variation of the seventh embodiment (with reference to FIG. 15). The supporting structure 108 may be configured to conform to the angularity of the corresponding electrode 1061.

Figure 20:
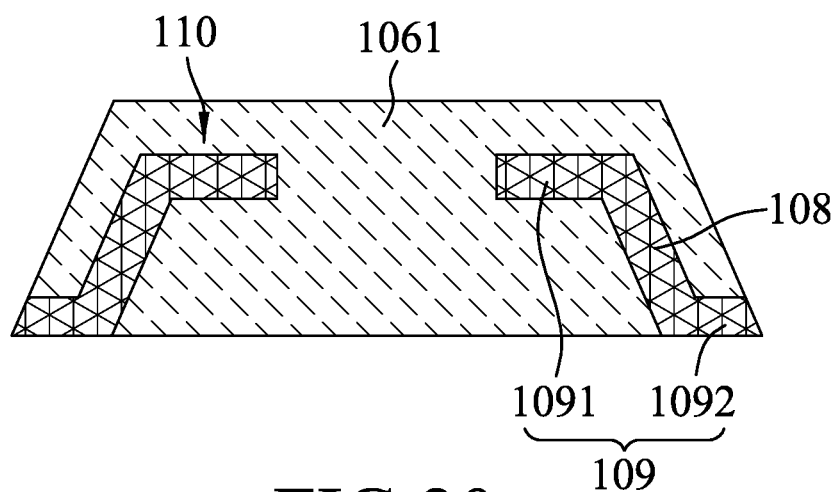
FIG. 20 is a cross-sectional schematic view similar to FIG. 18, illustrating the insulating unit in the electrode structure of another variation of the ninth embodiment of the LED according to the disclosure.

Referring to FIG. 20, another variation of the ninth embodiment is generally similar to the variation as shown in FIG. 19, except that in the another variation, the peripheral ring structure 109 includes the inner ring part 1091 and the outer ring part 1092, and the configurations thereof are similar to those described in the another variation of the seventh embodiment (with reference to FIG. 16) and thus the details thereof are omitted herein for sake of brevity.

To conclude, by forming the insulating unit 110 in each of the electrodes 1061, a compression force generated during a wire bonding process and exerted onto the electrodes 1061 can be greatly alleviated, so as to prevent fracture or deformation of the electrodes 1061, thereby improving the reliability of the LED 100 of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting diode (LED), comprising:
a substrate;

an epitaxial structure which includes a first semiconductor layer, an active layer and a second semiconductor layer that are sequentially disposed on said substrate in such order, said first semiconductor layer being formed as a step structure which includes a first portion and a second portion having a height lower than a height of said first portion, said active layer and said second semiconductor layer being disposed on said first portion; and an electrode structure including:

electrodes that are respectively disposed on said second portion of said first semiconductor layer and disposed on said second semiconductor layer opposite to said substrate, each of said electrodes having an upper surface and a lower surface that are respectively distal from and proximal to said substrate; and an insulating unit that is disposed in each of said electrodes, that is not exposed from said upper surface of each of said electrodes, and that includes a peripheral ring structure, said peripheral ring structure having an outer diameter that is not greater than a diameter of a corresponding one of said electrodes, and having a thickness that is smaller than a thickness of said corresponding one of said electrodes, wherein said insulating unit further includes a supporting structure that extends in an extension direction from said peripheral ring structure towards said epitaxial structure, and wherein in a direction perpendicular to the extension direction, said supporting structure has a thickness smaller than that of said peripheral ring structure.

2. The LED of claim 1, further comprising a current spreading layer that is disposed between said epitaxial structure and said electrode structure.

3. The LED of claim 1, wherein said insulating unit (110) includes a plate structure which has a diameter smaller than that of a corresponding one of said electrodes and which has a thickness smaller that of said corresponding one of said electrodes.

4. The LED of claim 3, wherein said plate structure is formed as discrete segments.

5. The LED of claim 1, wherein said peripheral ring structure is formed as discrete segments.

6. A light-emitting diode (LED), comprising:

a substrate;

an epitaxial structure which includes a first semiconductor layer, an active layer and a second semiconductor layer that are sequentially disposed on said substrate in such order, said first semiconductor layer being formed as a step structure which includes a first portion and a second portion having a height lower than a height of said first portion, said active layer and said second semiconductor layer being disposed on said first portion; and an electrode structure including:

electrodes that are respectively disposed on said second portion of said first semiconductor layer and disposed on said second semiconductor layer opposite to said substrate, each of said electrodes having an upper surface and a lower surface that are respectively distal from and proximal to said substrate; and an insulating unit that is disposed in each of said electrodes, that is not exposed from said upper surface of each of said electrodes, and that includes a peripheral ring structure, said peripheral ring structure having an outer diameter that is not greater than a diameter of a corresponding one of said electrodes, and having a thickness that is smaller than a thickness of said corresponding one of said electrodes;

wherein said insulating unit further includes a plate structure which is located at a level different from that of said peripheral ring structure, and which has a diameter that is smaller than that of said corresponding one of said electrodes.

7. The LED of claim 1, wherein said insulating unit further includes a plate structure which is disposed inward of said supporting structure and which is located at a level different from that of said peripheral ring structure, wherein said plate structure has a diameter smaller than an inner diameter of said supporting structure, and has a thickness smaller than that of said supporting structure in the extension direction.

8. The LED of claim 1, wherein said supporting structure extends to said lower surface of said corresponding one of said electrodes.

9. The LED of claim 1, wherein said peripheral ring structure includes:

an inner ring part which has an outer diameter smaller than the diameter of said corresponding one of said electrodes, and an outer ring part which is disposed outward of said supporting structure and which is located at a level different from that of said inner ring part, said outer ring part having an outer diameter that is not greater than the diameter of said corresponding one of said electrodes, having an inner diameter that is greater than a diameter of said supporting structure, and having a thickness that is smaller than a thickness of said supporting structure in the extension direction.

10. The LED of claim 1, wherein at least one of said electrodes is formed as a cylinder shape.

11. The LED of claim 1, wherein at least one of said electrodes is formed as a frustoconical shape and has a diameter that increases from said upper surface toward said lower surface.

12. The LED of claim 6, further comprising a current spreading layer that is disposed between said epitaxial structure and said electrode structure.

13. The LED of claim 6, wherein said plate structure is formed as discrete segments.

14. The LED of claim 6, wherein said peripheral ring structure is formed as discrete segments.

15. The LED of claim 6, wherein at least one of said electrodes is formed as a cylinder shape.

16. The LED of claim 6, wherein at least one of said electrodes is formed as a frustoconical shape and has a diameter that increases from said upper surface toward said lower surface.

* * * * *